(12) United States Patent
Hoang et al.

(10) Patent No.: US 8,120,429 B1
(45) Date of Patent: Feb. 21, 2012

(54) VOLTAGE-CONTROLLED OSCILLATOR METHODS AND APPARATUS

(75) Inventors: Tim Tri Hoang, San Jose, CA (US); Wilson Wong, San Francisco, CA (US); Kazi Asaduzzaman, Fremont, CA (US); Simardeep Maangat, Sunnyvale, CA (US); Sergey Shumarayev, San Leandro, CA (US); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/787,722

(22) Filed: May 26, 2010

Related U.S. Application Data

(62) Division of application No. 11/437,558, filed on May 19, 2006, now Pat. No. 7,728,674.

(51) Int. Cl.
*H03L 7/00* (2006.01)
*H03K 3/03* (2006.01)
(52) U.S. Cl. ............................... 331/2; 331/57
(58) Field of Classification Search ................ 331/2, 57, 331/175, 176, 177 V, 179, 173; 327/266, 327/269, 270, 274, 276, 280
See application file for complete search history.

(56) References Cited

U.S. PATENT DOCUMENTS

| | | | |
|---|---|---|---|
| 3,473,160 A | 10/1969 | Wahlstrom | |
| 4,494,021 A | 1/1985 | Bell et al. | |
| 4,633,488 A | 12/1986 | Shaw | |
| 4,719,593 A | 1/1988 | Threewitt et al. | |
| 4,857,866 A | 8/1989 | Tateishi | |
| 4,868,522 A | 9/1989 | Popat et al. | |
| 4,959,646 A | 9/1990 | Podkowa et al. | |
| 5,072,195 A | 12/1991 | Graham et al. | |
| 5,075,575 A | 12/1991 | Shizukuishi et al. | |
| 5,079,519 A | 1/1992 | Ashby et al. | |
| 5,121,014 A | 6/1992 | Huang | |

(Continued)

FOREIGN PATENT DOCUMENTS

EP  0 266 065  5/1988

(Continued)

OTHER PUBLICATIONS

Advanced Micro Devices, Inc., "Am2971 Programmable Event Generator (PEG)," Publication No. 05280, Rev. C, Amendment /0, pp. 4-286-4-303 (Jul. 1986).

(Continued)

*Primary Examiner* — Robert Pascal
*Assistant Examiner* — Gerald Stevens
(74) *Attorney, Agent, or Firm* — Ropes & Gray LLP

(57) ABSTRACT

Methods and apparatus are provided for generating a clock signal with relatively high bandwidth and relatively low phase noise. A circuit of the invention can include a pair of transistors serially coupled between a signal of relatively high voltage and a source of relatively low voltage, where a voltage of the signal of relatively high voltage can vary according to a voltage of a variable control signal. A gate of one of the pair of transistors can be coupled to an input clock signal, and an output node between the pair of transistors can be coupled to an output clock signal. The circuit can also include a third transistor, whose drain and source are coupled to the output clock signal, and whose gate can be coupled to a gear input signal. This circuit can advantageously operate under at least two different gears, each with different bandwidth and phase noise characteristics.

12 Claims, 4 Drawing Sheets

U.S. PATENT DOCUMENTS

| | | | |
|---|---|---|---|
| 5,133,064 | A | 7/1992 | Hotta et al. |
| 5,204,555 | A | 4/1993 | Graham et al. |
| 5,208,557 | A | 5/1993 | Kersh, III |
| 5,239,213 | A | 8/1993 | Norman et al. |
| 5,349,544 | A | 9/1994 | Wright et al. |
| 5,394,116 | A | 2/1995 | Kasturia |
| 5,397,943 | A | 3/1995 | West et al. |
| 5,418,499 | A | 5/1995 | Nakao |
| 5,420,544 | A | 5/1995 | Ishibashi |
| 5,424,687 | A | 6/1995 | Fukuda |
| 5,448,191 | A | 9/1995 | Meyer |
| 5,477,182 | A | 12/1995 | Huizer |
| 5,506,878 | A | 4/1996 | Chiang |
| 5,542,083 | A | 7/1996 | Hotta et al. |
| 5,581,214 | A | 12/1996 | Iga |
| 5,629,651 | A | 5/1997 | Mizuno |
| 5,642,082 | A | 6/1997 | Jefferson |
| 5,646,564 | A | 7/1997 | Erickson et al. |
| 5,656,959 | A | 8/1997 | Chang et al. |
| 5,677,650 | A * | 10/1997 | Kwasniewski et al. ......... 331/57 |
| 5,691,669 | A | 11/1997 | Tsai et al. |
| 5,699,020 | A | 12/1997 | Jefferson |
| 5,742,180 | A | 4/1998 | DeHon et al. |
| 5,744,991 | A | 4/1998 | Jefferson et al. |
| RE35,797 | E | 5/1998 | Graham et al. |
| 5,777,360 | A | 7/1998 | Rostoker et al. |
| 5,815,016 | A | 9/1998 | Erickson |
| 5,847,617 | A | 12/1998 | Reddy et al. |
| 5,889,436 | A | 3/1999 | Yeung et al. |
| 5,900,757 | A | 5/1999 | Aggarwal et al. |
| 5,952,891 | A | 9/1999 | Boudry |
| 5,963,069 | A | 10/1999 | Jefferson et al. |
| 5,970,110 | A | 10/1999 | Li |
| 5,974,105 | A | 10/1999 | Wang et al. |
| 5,987,543 | A | 11/1999 | Smith |
| 5,999,025 | A | 12/1999 | New |
| 6,014,048 | A | 1/2000 | Talaga, Jr. et al. |
| 6,043,677 | A | 3/2000 | Albu et al. |
| 6,069,506 | A | 5/2000 | Miller, Jr. et al. |
| 6,069,507 | A | 5/2000 | Shen et al. |
| 6,104,222 | A | 8/2000 | Embree |
| 6,114,915 | A | 9/2000 | Huang et al. |
| 6,141,394 | A | 10/2000 | Linebarger et al. |
| 6,144,242 | A | 11/2000 | Jeong et al. |
| 6,157,266 | A | 12/2000 | Tsai et al. |
| 6,249,189 | B1 | 6/2001 | Wu et al. |
| 6,252,419 | B1 | 6/2001 | Sung et al. |
| 6,278,332 | B1 | 8/2001 | Nelson et al. |
| 6,320,469 | B1 | 11/2001 | Friedberg et al. |
| 6,373,278 | B1 | 4/2002 | Sung et al. |
| 6,411,150 | B1 | 6/2002 | Williams |
| 6,462,623 | B1 | 10/2002 | Horan et al. |
| 6,483,886 | B1 | 11/2002 | Sung et al. |
| 6,642,758 | B1 | 11/2003 | Wang et al. |
| 6,856,180 | B1 | 2/2005 | Starr et al. |
| 6,924,678 | B2 | 8/2005 | Starr |
| 7,202,726 | B2 * | 4/2007 | Kunanayagam et al. ..... 327/274 |
| 7,227,918 | B2 | 6/2007 | Aung et al. |
| 7,355,486 | B2 * | 4/2008 | Kelkar et al. ................... 331/16 |
| 7,528,669 | B2 | 5/2009 | Milicevic et al. |
| 2002/0039051 | A1 * | 4/2002 | Ito et al. ............................ 331/25 |
| 2003/0210099 | A1 * | 11/2003 | Ingino, Jr. ........................ 331/57 |
| 2003/0227341 | A1 * | 12/2003 | Sawada ..................... 331/177 V |
| 2005/0024158 | A1 * | 2/2005 | Andrasic et al. ................ 331/57 |
| 2005/0156678 | A1 | 7/2005 | Lu |
| 2006/0145773 | A1 * | 7/2006 | Lin ................ 331/57 |

FOREIGN PATENT DOCUMENTS

| | | |
|---|---|---|
| EP | 0 416 930 | 3/1991 |
| EP | 0 778 517 | 6/1997 |
| EP | 0 987 822 | 3/2000 |
| EP | 1 056 207 | 11/2000 |
| JP | 1-137646 | 5/1989 |
| JP | 10-215156 | 8/1998 |

OTHER PUBLICATIONS

Advanced Micro Devices, Inc., "AmPAL*23S8 20-Pin IMOX™ PAL-Based Sequencer," Publication No. 06207, Rev. B, Amendment /0, pp. 4-102-4-121 (Oct. 1986).

Agere Systems, Inc., "ORCA® ORT82G5 1.0-1.25/2.0-2.5/3.125 Gbits/s Backplane Interface FPSC," Preliminary Data Sheet, pp. 1-35 (Jul. 2001).

Agere Systems, Inc., "ORCA® ORT8850 Field-Programmable System Chip (FPSC) Eight-Channel ×850 Mbits/s Backplane Transceiver," Product Brief, pp. 1-6 (Jul. 2001).

Agere Systems, Inc., "ORCA® ORT8850 Field-Programmable System Chip (FPSC) Eight-Channel ×850 Mbits/s Backplane Transceiver," Data Sheet, pp. 1-36 (Aug. 2001).

DynaChip Corp., "Using Phase Locked Loop (PLLs) in DL6035 Devices, Application Note" (1998).

DynaChip Corp., "DY6000™ Family, FAST Field Programmable Gate Array," DY6000 Family Datasheet, pp. 1-66 (Dec. 1998).

Ko, U., et al., "A 30-ps Jitter, 3.6-µs Locking, 3.3-Volt Digital PLL for CMOS Gate Arrays," Proceedings of the IEEE 1993 Custom Integrated Circuits Conference, Publication No. 0-7803-0826-3/93, pp. 23.3.1-23.3.4 (May 9-12, 1993).

LSI Logic Corp., "500K Technology Design Manual" (Document DB04-000062-00, First Edition), pp. 8-1-8-33 (Dec. 1996).

Lucent Technologies, Inc., "Optimized Reconfigurable Cell Array (ORCA®) OR3Cxxx/OR3Txxx Series Field-Programmable Gate Arrays," Preliminary Product Brief, pp. 1-8 (Nov. 1997).

Lucent Technologies, Inc., ORCA® Series 3 Field-Programmable Gate Arrays, Preliminary Data Sheet, Rev. 01, pp. 1-80 (Aug. 1998).

Monolithic Memories, Inc., "Programmable Array Logic PAL20RA10-20 Advance Information," pp. 5-95-5-102 (Jan. 1988)

National Semiconductor Corp., "LVDS Owners Manual & Design Guide" (Apr. 25, 1997).

National Semiconductor Corp., "DS90CR285/DS90CR286 +3.3V Rising Edge Data Strobe LVDS 28-Bit Channel Link-66 MHZ," pp. 1-16 (Mar. 1998).

Xilinx, Inc., "Virtex™ 2.5V Field Programmable Gate Arrays, Advance Product Specification," (Version 1.0), pp. 1-24 (Oct. 20, 1998).

Xilinx, Inc., "Using the Virtex Delay-Locked Loop, Advanced Application Note," (Version 1.31), pp. 1-14 (Oct. 21, 1998).

Zaks, R., et al., "From Chips to Systems: An Introduction to Microcomputers," Second Edition, pp. 54-61 (Prentice-Hall, Inc., Englewood Cliffs, N.J., 1987).

* cited by examiner

VOLTAGE-CONTROLLED OSCILLATOR METHODS AND APPARATUS

This is a division of U.S. patent application Ser. No. 11/437,558, filed May 19, 2006 now U.S. Pat. No. 7,728,674, which is hereby incorporated by reference herein in its entirety.

BACKGROUND OF THE INVENTION

This invention relates to transceiver circuitry. More particularly, this invention relates to voltage-controlled oscillators for use with transceiver circuitry.

Periodic clock signals are often used to facilitate the operation of transceiver circuitry (e.g., for data synchronization or modulation). Phase-locked loop ("PLL") circuitry is often used to generate such a periodic clock signal, which can often be substantially synchronized in frequency and phase to a reference clock signal. One key component of PLL circuitry is voltage-controlled oscillator ("VCO") circuitry, which can generate a clock signal whose phase and frequency vary according to a voltage of an input control signal.

Many challenges exist in the design of effective VCO circuitry. For instance, it is desirable to achieve a relatively high bandwidth, so that the frequency of the output clock signal generated by the VCO circuitry can vary over a relatively wide range. A relatively high bandwidth can be especially important if the VCO circuitry is used in a programmable logic device ("PLD"), because the VCO circuitry must be able to support a relatively large number of communication protocols. As another example, it is desirable to keep the phase noise of the clock signal relatively low. (Phase noise is a metric commonly used to quantify the jitter of a clock signal.) Traditional design goals, such as relatively low power consumption, relatively high performance (e.g., speed), and relatively low circuit area, are also considerations that often need to be taken into account when designing VCO circuitry.

Deficiencies exist in existing VCO circuitry that can make them undesirable or unsuitable for certain transceiver applications. For instance, the "LC-tank" VCO architecture relies on an inductance and a capacitance to define a baseline oscillation frequency for the VCO's output clock signal. Although such an approach can yield relatively low phase noise, the frequency range is also relatively narrow. In addition, the LC-tank VCO architecture often consumes relatively large circuit area and a relatively large amount of power.

In view of the foregoing, it would be desirable to provide methods and apparatus that can generate a clock signal with relatively high bandwidth and relatively low phase noise. In addition, it would be desirable to provide such methods and apparatus with relatively low power consumption, relatively high performance, and relatively low circuit area.

SUMMARY OF THE INVENTION

In accordance with this invention, methods and apparatus are provided for generating a clock signal with relatively high bandwidth and relatively low phase noise. Advantageously, such methods and apparatus are provided with relatively low power consumption, relatively high performance, and relatively low circuit area.

According to an embodiment of the invention, a circuit can include a pair of transistors serially coupled between a signal of relatively high voltage and a source of relatively low voltage, where a voltage of the signal of relatively high voltage can vary according to a voltage of a variable control signal. A gate of one of the pair of transistors can be coupled to an input clock signal, and an output node between the pair of transistors can be coupled to an output clock signal. The circuit can also include a third transistor, whose drain and source are coupled to the output clock signal, and whose gate can be coupled to a gear input signal. This circuit of the invention can advantageously operate under at least two different gears, each with different bandwidth and phase noise characteristics. (It will be understood that, as used herein, the expression "coupled to" can be used to define either a direct or an indirect connection between two elements.)

In another embodiment of the invention, a VCO circuit can include a plurality of VCO cells coupled to each other in a loop. The VCO circuit can include control circuitry coupled to a source of relatively high voltage and operable to generate a control input signal of the VCO cells. The VCO cells can be operable to receive a gear input signal. A delay of at least one of the VCO cells can be based on a voltage of the control input signal and a voltage of the gear input signal.

In yet another embodiment of the invention, a method can include setting a control signal of a VCO circuit, where the control signal can be coupled to a source of relatively low voltage through a pair of inverters coupled to each other. The method can also include setting a gear signal of the VCO circuit, and generating a pair of differential output clock signals of the pair of inverters. A frequency of the pair of differential output clock signals can be based on the control signal and the gear signal.

The invention therefore advantageously provides methods and apparatus for generating a clock signal with relatively high bandwidth and relatively low phase noise. Advantageously, such methods and apparatus are provided with relatively low power consumption, relatively high performance, and relatively low circuit area.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
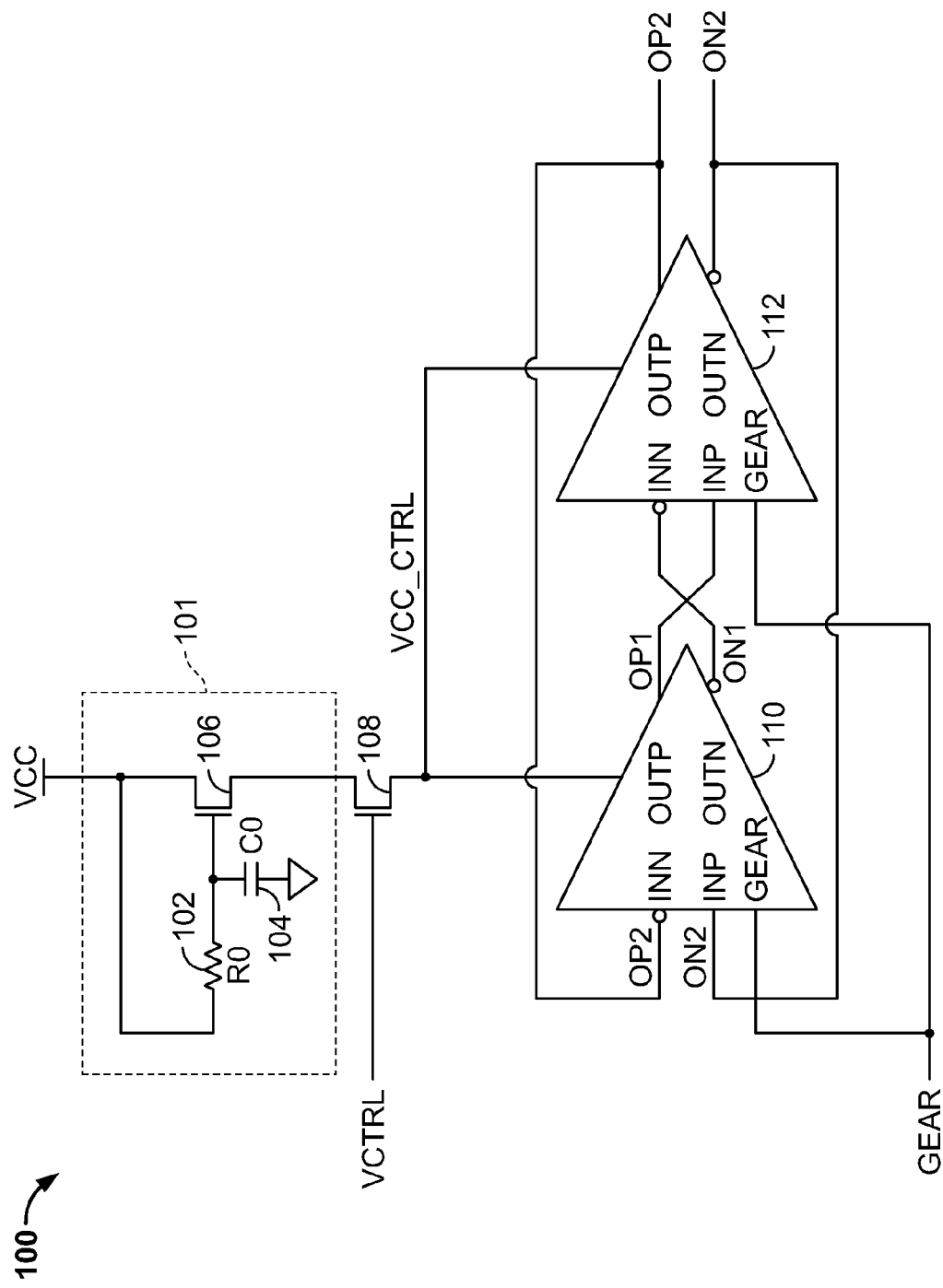
FIG. 1 is a circuit diagram showing an illustrative VCO circuit in accordance with an embodiment of the invention.

FIG. 1 is a circuit diagram showing an illustrative VCO circuit 100 in accordance with an embodiment of the invention. VCO circuit 100 can include voltage regulator circuitry 101, control circuitry 108, and VCO cells 110 and 112.

Voltage regulator circuitry 101 can be coupled to a source of relatively high voltage VCC (e.g., a power supply with a voltage of approximately 3.3V), and can advantageously be used to regulate the relatively high voltage. For instance, if the source of relatively high voltage is coupled to a plurality of VCO circuits, voltage regulator circuitry 101 can be used to desensitize VCO cells 110 and 112 from noise generated by other VCO circuits. In an embodiment of the invention, voltage regulator circuitry 101 can include resistor circuitry 102, capacitor circuitry 104, and transistor circuitry 106, coupled to each other as shown in FIG. 1. In an embodiment of the invention, resistance R0 of resistor circuitry 102 and capacitance C0 of capacitance circuitry 104 can be selected to provide at least a certain amount of attenuation (e.g., approximately −30 dB) in power supply noise. Transistor circuitry 106 preferably includes an N-type metal oxide semiconductor ("NMOS") transistor, which typically has a relatively high output impedance when compared to a P-type metal oxide semiconductor ("PMOS") transistor. Control circuitry 108 is preferably operable to accept a variable control signal VCTRL of VCO circuit 100, and to generate a control input signal VCC_CTRL of VCO cells 110 and 112. Variable control signal VCTRL can be generated by any appropriate circuitry (e.g., a loop filter or phase-frequency detector of a PLL circuit in which VCO circuit 100 resides). By varying the voltage of variable control signal VCTRL, the voltage of control input signal VCC_CTRL can be varied, which in turn can affect the delay through each of VCO cells 110 and 112. In an embodiment of the invention, control circuitry 108 preferably includes an NMOS transistor whose gate is coupled to variable control signal VCTRL, and whose drain is coupled to control input signal VCC_CTRL. In this embodiment, the NMOS transistor can advantageously further regulate relatively high voltage VCC. For example, if voltage regulator circuitry 101 can attenuate power supply noise by approximately −30 dB, voltage regulator circuitry 101 and control circuitry 108 together might be able to attenuate that noise by approximately −50 dB.

Control input signal VCC_CTRL can be coupled to VCO cells 110 and 112, and can preferably affect the propagation delay through those cells. In the illustrative embodiment shown in FIG. 1, VCO cells 110 and 112 are differential inverters that are cross-coupled to each other in a loop, such that their output signals (OP1, ON1, OP2, and ON2) are oscillatory in nature. In another embodiment, single-ended inverters could be used. In addition, although only two VCO cells 110 and 112 are used in the embodiment shown in FIG. 1 in order to conserve circuit area, it will be understood that any appropriate number of VCO cells could be used. For instance, if three inverting VCO cells were used, the cells would not have to be cross-coupled, as coupling the cells in a loop would already produce the desired oscillation. VCO cells 110 and 112 can be operable to accept a gear input signal GEAR, which can affect the bandwidth and phase noise characteristics of VCO cells 110 and 112, as described in more detail below in connection with FIG. 2.

VCO circuit 100 can provide a number of advantages over conventional VCO circuits (e.g., a known "current starved" VCO circuit). For instance, VCO circuit 100 employs relatively few transistors, which can yield relatively low switching noise. In addition, the tuning range of VCO circuit 100 can be relatively wide, and its voltage gain within that tuning range can be relatively uniform. In addition, a current starved VCO circuit often requires a finely-tuned voltage-controlled current source, which is not required in VCO circuit 100. Finally, VCO circuit 100 can yield improved phase noise performance, especially at relatively high frequencies, when compared to certain known VCO circuits.

Figure 2:
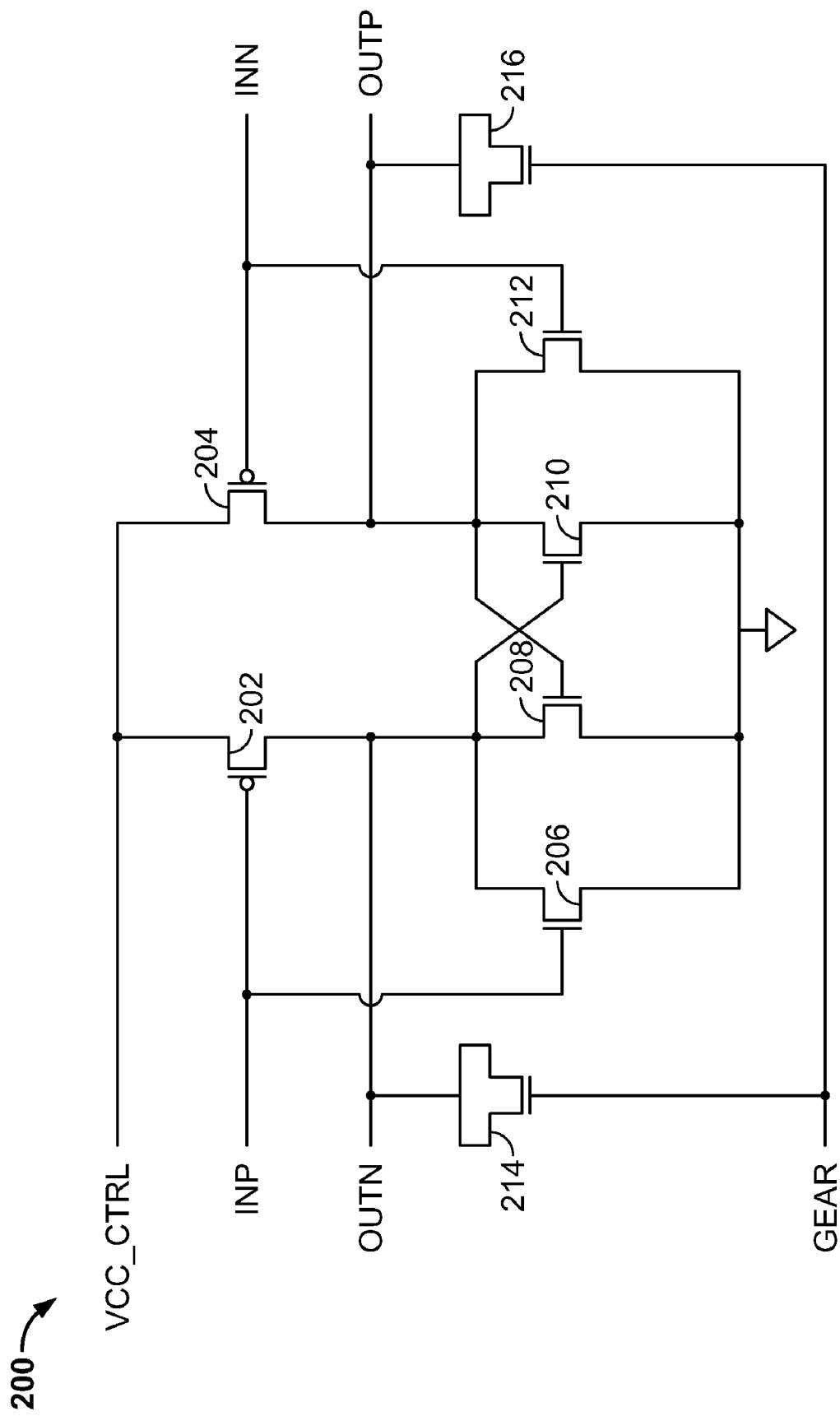
FIG. 2 is a circuit diagram showing an illustrative VCO cell in accordance with an embodiment of the invention.

FIG. 2 is a circuit diagram showing an illustrative VCO cell 200 in accordance with an embodiment of the invention. VCO cell 200 can be used as VCO cell 110, VCO cell 112, or both in VCO circuit 100. VCO cell 200 can be operable to receive control input signal VCC_CTRL, whose voltage can vary according to the voltage of a variable control signal (e.g., signal VCTRL in FIG. 1). Control input signal VCC_CTRL can supply a pair of inverters with a relatively high voltage. In the illustrative example shown in FIG. 2, a first inverter can include PMOS transistor 202 and NMOS transistor 206, which are coupled in series to each other between control input signal VCC_CTRL and a source of relatively low voltage (e.g., a ground voltage, commonly denoted as "GND"). Similarly, in the illustrative example shown in FIG. 2, a second inverter can include PMOS transistor 204 and NMOS transistor 212, which are coupled in series to each other between control input signal VCC_CTRL and a source of relatively low voltage. The first and second inverters can be coupled in parallel to each other.

The first inverter can be operable to receive input signal INP and generate output signal OUTN, which can have a logical value that is the inverse of the logical value carried by input signal INP. Similarly, the second inverter can be operable to receive input signal INN and generate output signal OUTP, which can have a logical value that is the inverse of the logical value carried by input signal INN. Input signals INP and INN preferably belong to a differential pair of input signals, whose logical value is conveyed by the relative voltages of signals INP and INN. For example, a logical "1" might be indicated by input signal INP carrying a voltage that is substantially higher than the voltage of input signal INN. On the other hand, a logical "0" might be indicated by input signal INP carrying a voltage that is substantially lower than the voltage of input signal INN. Similarly, output signals OUTP and OUTN preferably belong to a differential pair of output signals, whose logical value is conveyed by the relative voltages of signals OUTP and OUTN.

When input control signal VCC_CTRL carries a relatively low voltage (preferably still higher than the relatively low voltage coupled to transistors 206 and 212, e.g., GND), both inverters can switch relatively slowly, resulting in a longer delay through VCO cell 200. In this scenario, the VCO circuit in which VCO cell 200 resides can generate an output signal of relatively low frequency. On the other hand, when input control signal VCC_CTRL carries a relatively high voltage, both inverters can switch relatively quickly, resulting in a shorter delay through VCO cell 200. In this scenario, the VCO circuit in which VCO cell 200 resides can generate an output signal of relatively high frequency.

VCO cell 200 can preferably include NMOS feedforward transistors 208 and 210, which can be cross-coupled to each other as shown in FIG. 2. This NMOS cross-coupling can advantageously conserve circuit area and power consumption relative to full complementary metal oxide semiconductor ("CMOS") cross-coupling, which would also include a pair of cross-coupled PMOS transistors. In addition, employing NMOS cross-coupling instead of full CMOS cross-coupling can advantageously keep the output loading of VCO cell 200 relatively low. Transistors 202, 204, 206, 208, 210, and 212 can be sized to optimize the performance and functionality of VCO cell 200 according to any appropriate criteria. For example, the sizes of these transistors can be chosen in order to ensure that the delay through VCO cell 200 can vary within a desired range in response to varying VCC_CTRL, such that the frequency of output signals OUTN and OUTP can vary within a desired bandwidth.

In accordance with an embodiment of the invention, VCO cell 200 can include gear transistors 214 and 216, which can be coupled to output signals OUTN and OUTP, respectively. In addition, gear transistors 214 and 216 can be coupled to gear input signal GEAR, as shown. In the example shown in FIG. 2, gear transistor 214 can be an NMOS transistor whose drain and source are coupled to output signal OUTN, and whose gate is coupled gear input signal GEAR. Similarly, gear transistor 216 can be an NMOS transistor whose drain and source are coupled to output signal OUTP, and whose gate is coupled gear input signal GEAR.

When gear input signal GEAR is set to a logical "0," both transistors 214 and 216 can enter depletion mode (e.g., be "deactivated"), thereby yielding relatively small capacitive loads on output signals OUTN and OUTP and a relatively short delay for VCO cell 200. Thus, the VCO circuit in which VCO cell 200 resides can generate an output clock signal of relatively high frequency. Viewed another way, varying input control signal VCC_CTRL can vary the frequency of the output clock signal within a relatively wide frequency range. However, using relatively small capacitive loads at gear transistors 214 and 216 can reduce the amount of charging and discharging at output signals OUTN and OUTP, which can yield relatively large amounts of phase noise (e.g., due to flicker noise, wire noise, or thermal noise).

On the other hand, when gear input signal GEAR is set to a logical "1," both transistors 214 and 216 can enter inversion mode (e.g., be "activated"), thereby yielding relatively large capacitive loads on output signals OUTN and OUTP and a relatively long delay for VCO cell 200. Thus, the VCO circuit in which VCO cell 200 resides can generate an output clock signal of relatively low frequency. Viewed another way, varying input control signal VCC_CTRL can vary the frequency of the output clock signal within a relatively narrow frequency range. However, using relatively large capacitive loads at gear transistors 214 and 216 can increase the amount of charging and discharging at output signals OUTN and OUTP, which can make those signals relatively robust to phase noise (e.g., due to flicker noise, wire noise, or thermal noise).

VCO circuit 100 and VCO cell 200 are preferably laid out to achieve symmetrical geometry and substantially equal loading on all VCO cell outputs (e.g., OP1, ON1, OP2, and ON2 in FIG. 1). VCO cells 110 and 112 can be placed on top of a deep N-well to advantageously improve noise isolation. In addition, the substrate surrounding the deep N-well can be coupled to a dedicated power pin carrying a relatively low voltage (e.g., GND) to further enhance noise isolation. Decoupling capacitors can be placed around VCO circuit 100 to reduce noise even further. Additional layout considerations, such as device location, orientation, use of a guard ring, N-well/substrate taps, and dummy devices can also be varied as appropriate in order to further reduce the sensitivity of VCO circuit 100 and VCO cell 200 to noise.

Figure 3:
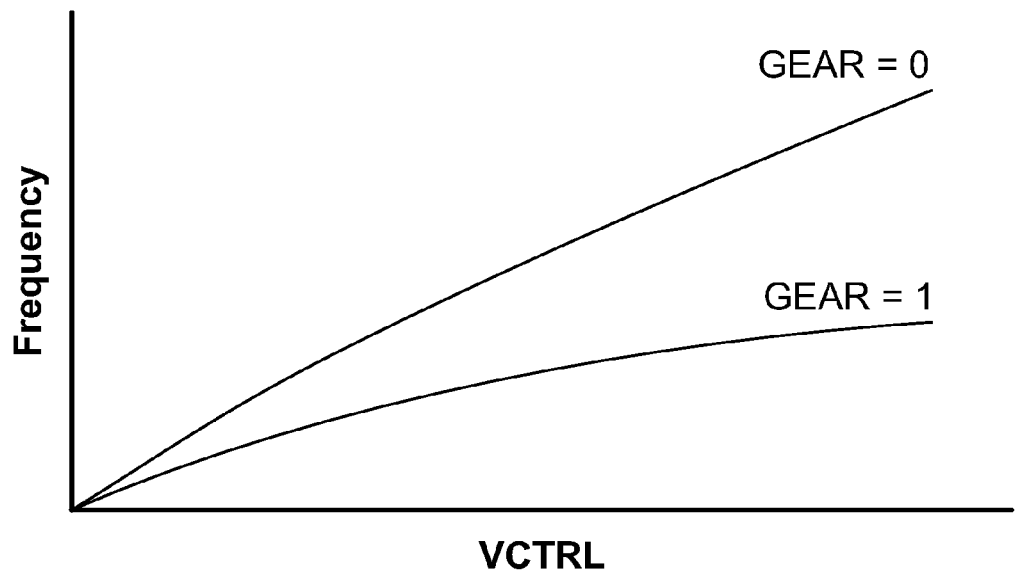
FIG. 3 is a graph showing illustrative relationships between frequency and control voltage in accordance with an embodiment of the invention.

FIG. 3 is a graph showing illustrative relationships between frequency and control voltage in accordance with an embodiment of the invention. In particular, FIG. 3 illustrates how the frequency of an output clock signal of a VCO circuit according to the invention can vary with the voltage of a variable control signal VCTRL. As discussed in connection with VCO cell 200 of FIG. 2, setting gear input signal GEAR to a logical "0" can reduce output capacitive load and yield a relatively wide bandwidth as variable control signal VCTRL is varied. Similarly, setting gear input signal GEAR to a logical "1" can increase capacitive load and yield a relatively narrow bandwidth as variable control signal VCTRL is varied.

Figure 4:
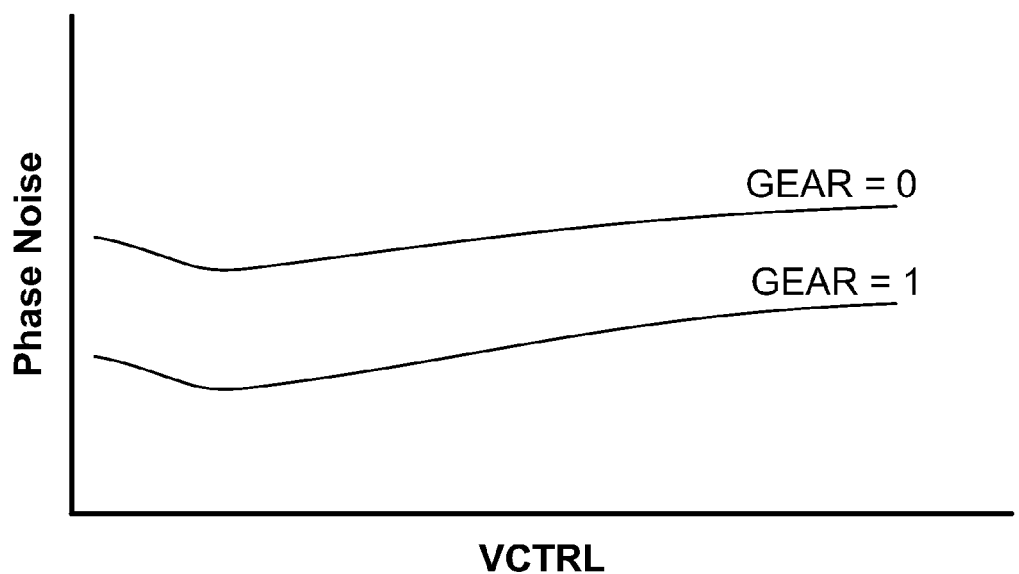
FIG. 4 is a graph showing illustrative relationships between phase noise and control voltage in accordance with an embodiment of the invention.

FIG. 4 is a graph showing illustrative relationships between phase noise and control voltage in accordance with an embodiment of the invention. In particular, FIG. 4 illustrates how the phase noise of an output clock signal of a VCO circuit according to the invention can vary with the voltage of a variable control signal VCTRL. As discussed in connection with VCO cell 200 of FIG. 2, setting gear input signal GEAR to a logical "0" can reduce output capacitive load and yield relatively high phase noise as variable control signal VCTRL is varied. Similarly, setting gear input signal GEAR to a logical "1" can increase capacitive load and yield a relatively low phase noise as variable control signal VCTRL is varied.

Inspecting the relationships illustrated in FIGS. 3 and 4, one can see that it is often desirable to set gear input signal GEAR to a logical "1," as that setting can desirably yield a lower degree of phase noise. However, this setting might not allow the VCO output clock signal to oscillate beyond a certain frequency. Thus, setting signal GEAR to a logical "1" may be desirable when the VCO circuit only needs to operate at relatively low frequencies. If the VCO circuit needs to operate at higher frequencies (e.g., to support operation with certain communication protocols), gear input signal GEAR can be set to a logical "0" to increase the bandwidth of the output clock signal generated by the VCO circuit. Although this setting may result in a relatively large phase noise at certain frequencies, this tradeoff may be acceptable in order to achieve the desired higher output clock frequencies. It will be understood that, even with gear input signal GEAR set to a logical "0," the phase noise of the VCO circuit of the invention can still be lower than that of many known VCO circuits, and the phase noise is only seen as high relative to the other gear setting.

Thus, a VCO circuit and VCO cells are provided in accordance with the invention to generate an output clock signal with relatively high bandwidth and relatively low phase noise. Advantageously, the circuitry of the invention can achieve relatively low power consumption, relatively high performance, and relatively low circuit area when compared to conventional approaches. It will be noted that the embodiments described herein are merely illustrative, and other embodiments could be used. For example, the concepts of the invention can be applied to a VCO circuit with greater than two gears. As another example, level shifter circuitry can be employed to properly adjust the common-mode voltage (i.e., the average voltage of two differential output clock signals) of VCO circuit 100 as appropriate. In addition, current steering circuitry can be coupled to output clock signals of the VCO circuit 100. This current steering circuitry can preferably improve phase noise characteristics of the output clock signals, though it may also increase power consumption. It will be understood that other embodiments can be used without deviating from the spirit or scope of the invention.

Figure 5:
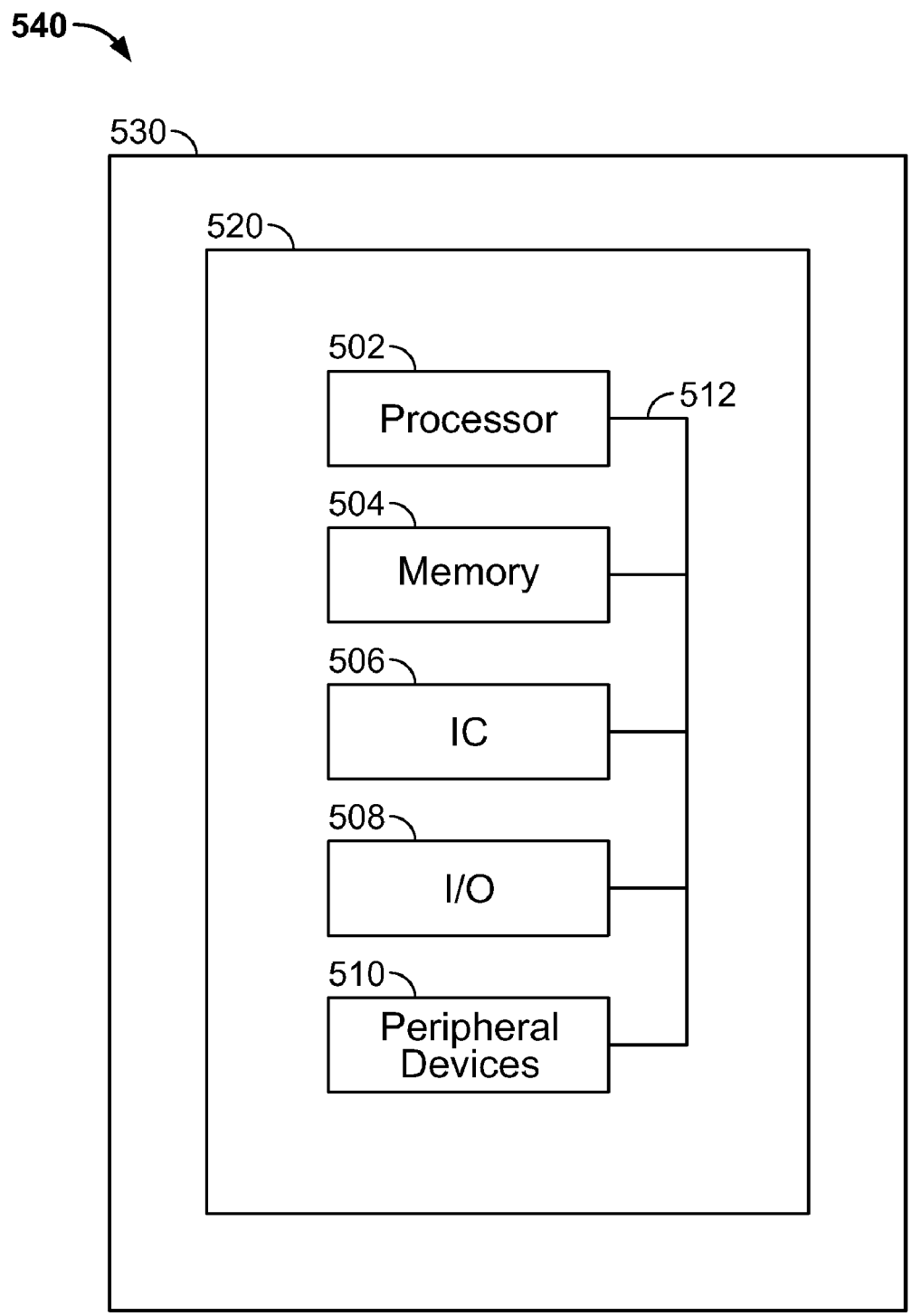
FIG. 5 is a block diagram of a data processing system incorporating the invention.

FIG. 5 illustrates an IC 506, which incorporates VCO methods and apparatus in accordance with this invention, in a data processing system 540. IC 506 may be a PLD, an application-specific IC ("ASIC"), or a device possessing characteristics of both a PLD and an ASIC. Data processing system 540 may include one or more of the following components: processor 502; memory 504; I/O circuitry 508; and peripheral devices 510. These components are coupled together by a system bus 512 and are populated on a circuit board 520 which is contained in an end-user system 530.

System 540 can be used in a wide variety of applications, such as computer networking, data networking, instrumentation, video processing, or digital signal processing. IC 506 can be used to perform a variety of different logic functions. For example, IC 506 can be configured as a processor or controller that works in cooperation with processor 502. IC 506 may also be used as an arbiter for arbitrating access to a shared resource in system 540. In yet another example, IC 506 can be configured as an interface between processor 502 and one of the other components in system 540.

Thus it is seen that methods and apparatus are provided for generating a clock signal with relatively high bandwidth and relatively low phase noise. One skilled in the art will appreciate that the invention can be practiced by other than the described embodiments, which are presented for purposes of illustration and not of limitation, and the present invention is limited only by the claims which follow.

What is claimed is:

1. A voltage-controlled oscillator ("VCO") circuit comprising:
 a plurality of VCO cells coupled to each other in a loop; and
 control circuitry coupled to a source of relatively high voltage and operable to generate a control input signal of said plurality of VCO cells, wherein:
 said plurality of VCO cells is operable to receive a gear input signal;
 a delay through at least one of said VCO cells is based on a voltage of said control input signal, and a capacitive load on an output signal of said at least one of said VCO cells is based on a voltage of said gear input signal;
 when said gear input signal is in a first state, output of said VCO circuit has a first phase noise characteristic, and varying said control input signal varies frequency of said output of said VCO circuit within a first range having a starting point; and
 when said gear input signal is in a second state, output of said VCO circuit has a second phase noise characteristic noisier than said first phase noise characteristic, and varying said control input signal varies frequency of said output of said VCO circuit within a second range having said starting point, wherein the second range is larger than said first range.

2. The VCO circuit of claim 1 wherein each of said VCO cells comprises a pair of differential inverter circuits cross-coupled to each other.

3. The VCO circuit of claim 1 further comprising voltage regulator circuitry coupled between said source of relatively high voltage and said control circuitry.

4. The VCO circuit of claim 3 wherein said voltage regulator circuitry comprises:
 a transistor whose drain is coupled to said source of relatively high voltage and whose source is coupled to said control circuitry;
 resistor circuitry coupled between a gate of said transistor and said source of relatively high voltage; and
 capacitor circuitry coupled between said gate of said transistor and a source of relatively low voltage.

5. The VCO circuit of claim 1 wherein said at least one VCO cell comprises a pair of inverters coupled in parallel between said control input signal and a source of relatively low voltage.

6. The VCO circuit of claim 5 wherein said at least one VCO cell further comprises a pair of gear transistors respectively associated with said pair of inverters, wherein:
 an output signal of each inverter of said pair of inverters is coupled to a drain and a source of said respective gear transistor; and
 a gate of each said gear transistor is coupled to said gear input signal.

7. The VCO circuit of claim 5 further comprising a pair of feedforward transistors respectively associated with said pair of inverters, wherein:
 an output signal of each said inverter is coupled to a corresponding drain of one of said pair of feedforward transistors and a corresponding gate of the other of said pair of feedforward transistors; and
 a source of each said feedforward transistor is coupled to said source of relatively low voltage.

8. A programmable logic device comprising the VCO circuit of claim 1.

9. A method comprising:
 setting a control signal of a voltage-controlled oscillator ("VCO") circuit, wherein said control signal is coupled to a source of relatively low voltage through a pair of inverters coupled to each other;
 setting a gear signal of said VCO circuit; and
 generating a pair of differential output clock signals of said pair of inverters, wherein:
 a frequency of said pair of differential output clock signals is based on (1) said control signal and (2) capacitive loads on said pair of differential output clock signals, said capacitive loads being based on said gear signal;
 when said gear signal is in a first state, said control signal varies said frequency within a first range having a starting point, and said pair of differential output clock signals has a first phase noise characteristic; and
 when said gear signal is in a second state, said control signal varies said frequency within a second range having said starting point, wherein the second range is larger than said first range, and said pair of differential output clock signals has a second phase noise characteristic noisier than said first phase noise characteristic.

10. The method of claim 9 further comprising switching a gear transistor in response to said setting said gear signal, wherein a drain and a source of said gear transistor are coupled to one of said pair of differential output clock signals.

11. The method of claim 9 further comprising coupling one of said pair of differential output clock signals to said source of relatively low voltage through a feedforward transistor that is activated in response to generating the other of said pair of differential output clock signals.

12. The method of claim 9 further comprising regulating said control signal using regulator circuitry coupled between said control signal and a source of relatively high voltage.

* * * * *